(12) United States Patent
Takadate et al.

(10) Patent No.: US 11,848,132 B2
(45) Date of Patent: Dec. 19, 2023

(54) COIL COMPONENT AND METHOD FOR MANUFACTURING SAME

(71) Applicant: Taiyo Yuden Co., Ltd., Tokyo (JP)

(72) Inventors: Kinshiro Takadate, Tokyo (JP); Atsushi Tanada, Tokyo (JP); Kengo Tsuchiya, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 268 days.

(21) Appl. No.: 17/543,520

(22) Filed: Dec. 6, 2021

(65) Prior Publication Data

US 2022/0199303 A1 Jun. 23, 2022

(30) Foreign Application Priority Data

Dec. 17, 2020 (JP) ................... 2020-209248

(51) Int. Cl.
*H01F 1/147* (2006.01)
*H05K 1/18* (2006.01)
*H01F 41/04* (2006.01)
*H01F 41/02* (2006.01)

(52) U.S. Cl.
CPC ......... *H01F 1/147* (2013.01); *H01F 41/0246* (2013.01); *H01F 41/04* (2013.01); *H05K 1/181* (2013.01); *H05K 2201/1003* (2013.01)

(58) Field of Classification Search
CPC ............. H01F 1/147; H01F 1/14766; H05K 2201/1003
See application file for complete search history.

(56) References Cited

U.S. PATENT DOCUMENTS

| 5,476,554 A * | 12/1995 | Ishii ................. C22C 38/28 148/606 |
| 2012/0188049 A1* | 7/2012 | Matsuura ............. B22F 1/16 336/212 |
| 2012/0274437 A1* | 11/2012 | Matsuura ........... H01F 27/255 336/221 |
| 2012/0274438 A1* | 11/2012 | Hachiya ........... H01F 17/0013 336/221 |

FOREIGN PATENT DOCUMENTS

| JP | 2013-046055 A | 3/2013 |
| WO | WO 2018/131536 A1 | 7/2018 |

* cited by examiner

*Primary Examiner* — Sherman Ng
(74) *Attorney, Agent, or Firm* — Stein IP, LLC

(57) ABSTRACT

One aspect of the present invention is a coil component comprising: a magnetic substrate formed with magnetic metal particles containing Fe, Si and Cr, and a bonding layer containing oxygen and nitrogen that bonds the magnetic metal particles to each other; and a conductor arranged inside or on the surface of the magnetic substrate.

8 Claims, 4 Drawing Sheets

COIL COMPONENT AND METHOD FOR MANUFACTURING SAME

CROSS-REFERENCE TO RELATED APPLICATIONS

This application claims the benefit of Japanese Application No. 2020-209248, filed Dec. 17, 2020, in the Japanese Patent Office. All disclosures of the document named above are incorporated herein by reference.

BACKGROUND OF THE INVENTION

Technical Field

The present invention relates to a coil component and a manufacturing method therefor.

Background Art

In order to promote further miniaturization and higher performance in high-frequency communication systems such as mobile phones, there is demand for electronic components mounted inside that are miniaturized and that have higher performance. In coil components such as inductors, increased current is one of the indicators of improved performance. In order to meet these demands for greater miniaturization and increased current, magnetic metal materials that are less likely than ferrite materials to become magnetically saturated have been introduced as the magnetic materials used in coil components.

Because the electrical insulating properties of these magnetic metal materials is inferior to that of ferrite materials, an insulating layer is often formed on the surface of the particles constituting the magnetic metal material to electrically insulate the particles from each other.

For example, Patent Document 1 discloses a magnetic core material having a structure in which the alloy particles are bonded to each other via an oxide film on the surface by heat-treating a molded body consisting of Fe—Si—Cr-based soft magnetic alloy particles in an oxygen atmosphere. This magnetic core material is characterized by high mechanical strength and good insulating properties that can be easily obtained due to the presence of an oxide layer between particles.

Patent Document 2 discloses a method for creating a molded body using magnetic particles in which an insulating film has been formed beforehand on a core of an iron-containing soft magnetic material by using a sol-gel reaction.

PRIOR ART DOCUMENTS

Patent Documents

[Patent Document 1] JP 2013-046055 A
[Patent Document 2] WO 2018/131536 A1

SUMMARY OF THE INVENTION

Problems to be Solved by the Invention

In a powder core obtained by molding a magnetic powder as disclosed in Patent Documents 1 and 2, the saturation magnetic flux density is improved by increasing the fill rate of the magnetic powder constituting the powder core and by reducing the thickness of the insulating film on the surface of each particle constituting the magnetic powder. As a result, a coil component of the same volume can handle a larger input current, and a coil component with a smaller volume can handle the same input current.

When the fill rate of the magnetic powder is increased to improve the saturation magnetic flux density, voids in the molded body serving as the powder core or precursor thereof are reduced. As a result, when an oxide insulating film is formed by heat-treating a molded body in an oxygen atmosphere as in Patent Document 1, the void reduction in the molded body may cause the following problems. First, the reduction in the amount of oxygen diffused inside the molded body may suppress the oxidation reaction inside the molded body, formation of the insulating film may become insufficient, and insulation of the magnetic core may be reduced. When measures are taken such as increasing the oxygen concentration in the heat treatment atmosphere, raising the heat treatment temperature and/or lengthening the heat treatment time in order to suppress the decrease in insulating properties, the alloy particles near the surface of the molded body may become excessively oxidized and their magnetic properties may deteriorate.

In the technique described in Patent Document 2 for molding magnetic particles with an insulating film formed beforehand on a core made of a soft magnetic material, the insulating film tends to be thicker than when the insulating film is formed by heat treating the molded body. As a result, the volume ratio of the insulating film on the molded body increases, and the ratio of the soft magnetic material decreases by the same ratio, making it difficult to improve the saturation magnetic flux density. Another problem with this manufacturing method is that manufacturing costs increase because separate processing must be provided for forming an insulating film on the core.

Therefore, it is an object of the present invention to provide a coil component equipped with a powder core having high electrical insulating properties as a magnetic substrate in which magnetic metal particles are bonded to each other via a thin insulating film.

Means for Solving the Problems

As a result of extensive research conducted to solve these problems, the present inventors discovered that a magnetic substrate in which magnetic metal particles are bonded to each other via a bonding layer containing oxygen and nitrogen could be obtained by degreasing and then heat treating a molded body of a magnetic metal powder containing Fe, Si and Cr in a nitrogen atmosphere substantially free of oxygen before performing the heat treatment for forming the insulating film, and that this solved the problems described above. The present invention is a product of this discovery.

In order to solve these problems, a first aspect of the present invention is a coil component comprising: a magnetic substrate formed with magnetic metal particles containing Fe, Si and Cr, and a bonding layer containing oxygen and nitrogen that bonds the magnetic metal particles to each other; and a conductor arranged inside or on the surface of the magnetic substrate.

A second aspect of the present invention is a method for manufacturing a coil component, the method comprising: molding a magnetic metal powder composed of magnetic metal particles containing Fe, Si and Cr into a molded body; performing a first heat treatment by heating the molded body in a nitrogen atmosphere substantially free of oxygen; performing a second heat treatment on the molded body after the first heat treatment in an oxygen-containing atmosphere to obtain a magnetic substrate; and arranging a conductor on the surface of the magnetic substrate.

A third aspect of the present invention is a method for manufacturing a coil component, the method comprising: molding a magnetic metal powder composed of magnetic metal particles containing Fe, Si and Cr and a conductor or precursor thereof into a molded body with the conductor or precursor thereof arranged inside; performing a first heat treatment by heating the molded body in a nitrogen atmosphere substantially free of oxygen; and performing a second heat treatment on the molded body after the first heat treatment in an oxygen-containing atmosphere.

A fourth aspect of the present invention is a circuit board on which a coil component according to the first aspect has been mounted.

Effect of the Invention

The present invention is able to provide a coil component equipped with a powder core having high electrical insulating properties as a magnetic substrate in which magnetic metal particles are bonded to each other via a thin insulating film.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DESCRIPTION OF THE SYMBOLS

100: Coil component
10: Magnetic substrate (magnetic powder core)
1: Magnetic metal particles
2: Bonding layer
20: Conductor
A, B: End points of line segment to be analyzed
w: Thickness of bonding layer
c: Midpoint of line segment obtained by cutting line segment AB at both ends of the bonding layer

DETAILED DESCRIPTION OF THE EMBODIMENTS

The following is a technical explanation of the configuration and operational effects of the present invention with reference to the drawings. However, the mechanism of action includes speculation, and the correctness of this speculation does not limit the present invention. The numerical ranges (two numbers linked by "-") include the numbers indicating the lower value and the upper value.

[Coil Component]

Figure 1:
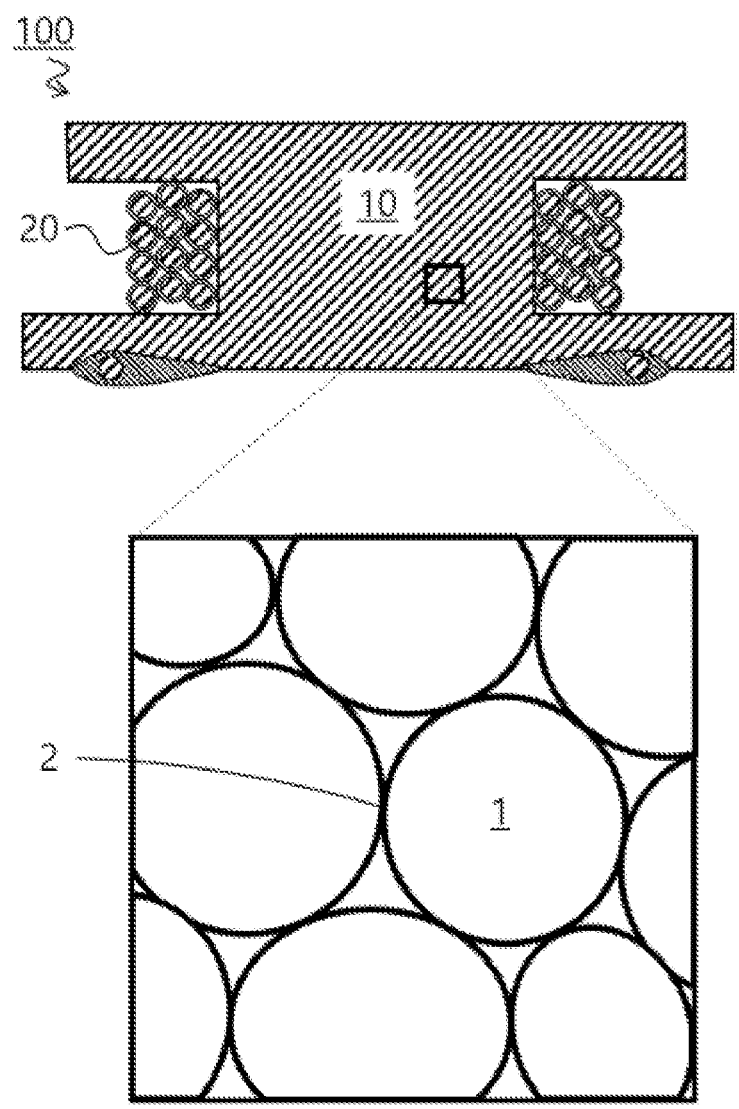
FIG. 1 is a diagram showing the configuration of the coil component in the first aspect of the present invention.

As shown in FIG. 1, the coil component 100 in the first aspect of the present invention (referred to simply as the "first aspect" below) comprises a magnetic substrate 10 formed with magnetic metal particles 1 containing Fe, Si and Cr, and a bonding layer 2 containing oxygen and nitrogen that bonds the magnetic metal particles to each other, and a conductor 20 arranged inside or on the surface of the magnetic substrate 10. In FIG. 1, the conductor 20 takes the form of wire wound around the surface of the magnetic substrate 10, but the first aspect is not limited to this form.

The magnetic metal particles 1 contain Fe as an essential component. When the magnetic metal particles 1 contain Fe, the magnetic substrate 10 can have a high magnetic permeability and a high saturation magnetic flux density. There are no particular restrictions on the Fe content of the magnetic metal particles 1 as long as the magnetic substrate 10 has the desired characteristics. Because a higher Fe content leads to higher magnetic permeability and a higher saturation magnetic flux density, the Fe content is preferably 80 mass % or more, more preferably 85 mass % or more, and even more preferably 90 mass % or more. From the standpoint of suppressing the deterioration in magnetic properties due to oxidation of Fe and the generation of eddy currents, the Fe content is preferably 99 mass % or less, and more preferably 98 mass % or less.

The magnetic metal particles 1 contain Si as an essential component. When the magnetic metal particles 1 contain Si, the electric resistance becomes higher and the deterioration in magnetic characteristics due to eddy currents can be suppressed. There are no particular restrictions on the Si content of the magnetic metal particles 1 as long as the magnetic substrate 10 has the desired characteristics. From the standpoint of sufficiently suppressing eddy currents, the Si content is preferably 1 mass % or more, and more preferably 1.5 mass % or more. From the standpoint of increasing the Fe content of the magnetic metal particles 1 to obtain excellent magnetic properties, the Si content is preferably 5 mass % or less, and more preferably 4.5 mass % or less.

The magnetic metal particles 1 contain Cr as an essential component. When the magnetic metal particles 1 contain Cr, oxidation of the Fe in the particles is suppressed, and a high magnetic permeability and saturated magnetic flux density can be maintained. There are no particular restrictions on the Cr content of the magnetic metal particles 1 as long as the magnetic substrate 10 has the desired characteristics. From the standpoint of sufficiently suppressing oxidation of the Fe, the Cr content is preferably 0.5 mass % or more, and more preferably 1 mass % or more. From the standpoint of increasing the Fe content of the magnetic metal particles to obtain excellent magnetic properties, the Cr content is preferably 5 mass % or less, and more preferably 4.5 mass % or less.

The magnetic metal particles 1 may contain elements other than the essential components mentioned above as long as the object of the present invention can be achieved. Examples of other elements that can be used include Al, Ti, and Zr.

In the magnetic substrate 10, magnetic metal particles 1 are bonded to adjacent magnetic metal particles 1 by a bonding layer 2 containing oxygen and nitrogen.

The bonding layer 2 contains oxygen. This is because the bonding layer 2 is formed by the oxidation of the elements in the magnetic metal particles 1. Fe, Si, and Cr, which are the essential components in the magnetic metal particles 1, all have higher oxide electrical resistivity than the magnetic metal particles 1. Therefore, the magnetic metal particles 1 can be electrically insulated from each other by including oxygen in the bonding layer 2 bonding the magnetic metal particles 1 to each other, that is, by including an oxide of at least one of the elements selected from among Fe, Si, and Cr.

The bonding layer 2 contains nitrogen. This makes effective electrical insulation possible between the magnetic metal particles 1. It is believed that the presence of nitrogen indicates that the Cr oxide concentration in the bonding layer 2 is sufficiently higher than the Fe oxide concentration. Cr has higher reactivity with nitrogen than the other components in the magnetic metal particles 1. Therefore, the nitrogen in the bonding layer 2 bonds with Cr and is present as a nitride or an oxynitride. In addition to Cr nitrides or oxynitrides, Cr oxides resulting from the oxidation of these compounds are present in a relatively high concentration in the region where nitrogen is present in the bonding layer 2. $Cr_2O_3$, which is an oxide of Cr, has a stable Cr valence of +3 and has good electrical insulating properties. Fe is known to form various oxides such as $Fe_2O_3$ (hematite) and $Fe_3O_4$ (magnetite). When oxidized with a small amount of oxygen, magnetite with a valence of both +2 and +3 is produced. Because magnetite exhibits conductivity due to hopping conduction caused by fluctuations in the valence of Fe, the electrical insulating properties between the magnetic metal particles 1 decrease when they are present in the bonding layer 2. However, because Fe has poor reactivity with nitrogen, the concentration is relatively low in the region where nitrogen is present. As a result, the concentration of magnetite, which exhibits conductivity, is also low. Consequently, electrical insulating properties between magnetic metal particles 1 can be effectively realized when the nitrogen-containing bonding layer 2 has a high concentration of $Cr_2O_3$, which has good electrical insulating properties, and a low concentration of magnetite, which has conductive properties.

Figure 2:
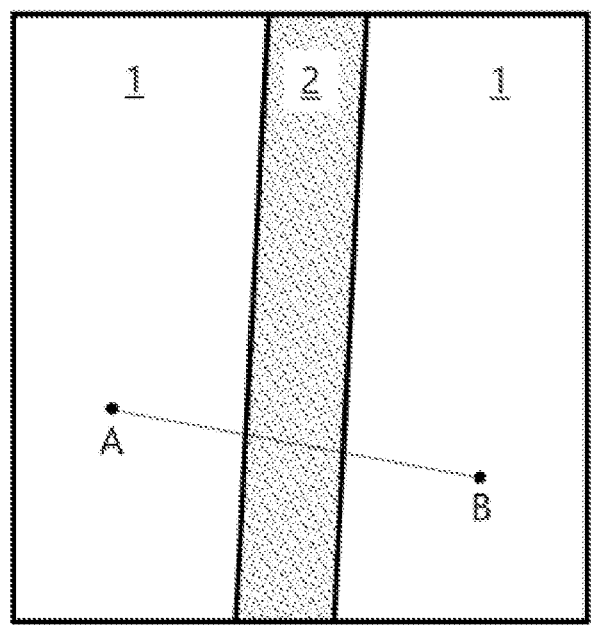
FIG. 2 is a diagram used to explain the method for determining the composition of the magnetic metal particles and the bonding layer in the first aspect of the present invention.
Figure 2:
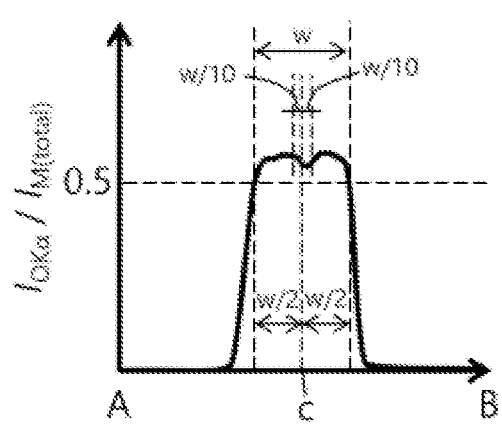

Here, the compositions of the magnetic metal particles 1 and the bonding layer 2 described above are determined using the following procedure. First, a thin sample with a thickness of 50 nm to 100 nm is taken from the central portion of the magnetic substrate 10 using a focused ion beam device (FIB), and placed immediately in a scanning transmission electron microscope (STEM) equipped with an annular dark field detector and an energy dispersive X-ray spectroscopy (EDS) detector. Next, a STEM observation is performed on the thin sample, and a bonded portion in which magnetic metal particles 1 are bonded to each other via a bonding layer 2 is identified based on the difference in contrast (brightness) as shown schematically in FIG. 2. Next, on the identified bonded portion, a line analysis is performed by EDS along line segment AB from point A in one magnetic metal particle 1 to point B in another magnetic metal particle 1 via the bonding layer 2. The measurement conditions for EDS are an acceleration voltage of 200 kV and an electron beam diameter of 1.0 nm, and the measurement time is set so that the integrated value of the signal strength in the range from 6.22 keV to 6.58 keV is 25 counts or more at each point in the magnetic metal particles 1. The interval between measurement points is also set so that the number of measurement points in the central portion of the bonding layer 2 described below is 5 points or more. Next, the ratio ($I_{OK\alpha}/I_{M(total)}$) of the signal intensity ($I_{OK\alpha}$) of OKα rays to the total signal intensity ($I_{M(total)}$) of the strongest characteristic X-rays of each detected metal element is calculated at each measurement point. For example, when Fe and Cr are detected as metal elements, the ratio ($I_{OK\alpha}/(I_{FeK\alpha}+I_{CrK\alpha})$) of the signal intensity of OKα rays to the total of the signal intensity of Kα rays ($I_{FeK\alpha}$) that indicates the maximum intensity of the characteristic X-rays of Fe and the signal intensity of Kα rays ($I_{CrK\alpha}$) that indicates the maximum intensity of the characteristic X-rays of Cr is calculated as $I_{OK\alpha}/I_{M(total)}$. The region where this value is 0.5 or more is defined as the bonding layer 2, and the region where the value is less than 0.5 is defined as the magnetic metal particles 1. Next, for the region defined as the magnetic metal particles 1, the ratio of the elements at each measurement point is calculated in mass percentages. Of three consecutive measurement points in which the fluctuation of the content ratio of each element is within ±1 mass %, the average value of the content ratio of each element is calculated for the ones closest to the bonding layer 2, and this is used as the composition of the magnetic metal particles 1. When the composition of the magnetic metal powder used to produce the magnetic substrate 10 is known, the known composition may be used as the composition of the magnetic metal particles 1. Next, the thickness "w" of the bonding layer 2 is calculated from the distance between the measurement points located in the region defined as the bonding layer 2. The region where the distance from the midpoint "c" of the line segment obtained by cutting line segment AB at both ends of the bonding layer 2 in the direction of both ends of the bonding layer 2 is within 10% of the thickness "w" of the bonding layer 2, that is, the region located in the center of the bonding layer 2 corresponding to 20% of the thickness "w" of the bonding layer 2 is defined as the central portion of the bonding layer 2. Finally, the atomic ratio (at %) of each element is calculated at each measurement point located in the central portion of the bonding layer 2, and an average value of five consecutive points selected arbitrarily based on these ratios is used as the composition of the bonding layer 2.

The inclusion of nitrogen in the bonding layer 2 is confirmed as being 0.03 or more by calculating the atomic ratio (N/O) of nitrogen (N) to oxygen (O) in the composition of the bonding layer 2 determined using the method described above. The presence of nitrogen in the bonding layer 2 is determined in this way because the ratio of nitrogen is very low, at most several at %, while the ratio of oxygen in the bonding layer 2 is 50 to 60 at %, and when the atomic ratio (N/O) is less than 0.03, it becomes difficult to distinguish between characteristic X-rays caused by nitrogen and by noise and the presence of nitrogen cannot be determined. When the atomic ratio (N/O) is 0.03 or more, it can be confirmed that nitrogen is definitely present in the bonding layer 2. There are no particular restrictions on the upper limit of nitrogen in the bonding layer 2. Because nitrogen is primarily introduced to the bonding layer 2 by the heat treatment (first heat treatment) performed in a nitrogen atmosphere substantially free of oxygen after the degreasing of the molded body, as described below, the atomic ratio (N/O) in the bonding layer 2 formed under general heat treatment conditions is approximately 0.20 or less. In a bonding layer 2 formed by heat treatment at a low temperature to suppress oxidation of the magnetic metal particles 1 as much as possible, the atomic ratio (N/O) is about 0.16 or less. Note that a nitrogen atmosphere substantially free of oxygen in the present specification means an atmosphere which a nitrogen concentration is not lower than that of a gas usually available as nitrogen gas, and an oxygen concentration of approximately 10 ppm or less.

The bonding layer 2 preferably has an atomic ratio (N/O) of nitrogen (N) to oxygen (O) of 0.04 or more. This means the Cr oxide concentration in the bonding layer 2 is sufficiently higher than the Fe oxide concentration, the electrical insulating properties of the bonding layer 2 are further improved, and more effective electrical insulating properties between the magnetic metal particles 1 is possible. From this standpoint, the atomic ratio (N/O) in the bonding layer 2 is more preferably 0.05 or more, and even more preferably 0.07 or more.

The magnetic substrate 10 preferably has an Fe content of 90% by mass or more in the magnetic metal particles 1 and an atomic ratio (Cr/Fe) of chromium (Cr) to iron (Fe) in the bonding layer 2 of 3.0 or more. Although an Fe content in the magnetic metal particles 1 of 90% by mass or more is preferable from the standpoint of obtaining excellent magnetic properties, this tends to make the Fe concentration in the bonding layer 2 high and the formation of magnetite may result in insufficient electrical insulating properties between the magnetic metal particles 1. Even when the magnetic metal particles 1 have a high Fe content ratio, sufficient electrical insulating properties can be maintained by establishing an atomic ratio (Cr/Fe) of 3.0 or more in the bonding layer 2. From the standpoint of obtaining higher electrical insulating properties, the atomic ratio (Cr/Fe) is more preferably 3.5 or more, even more preferably 4.0 or more, and still more preferably 4.5 or more.

There are not any particular restrictions on the material, shape, and arrangement of the conductor 20 used in the first aspect, and these may be determined based on the required characteristics. Examples of materials include silver, copper, and alloys thereof. Examples of shapes include a linear shape, a meandering shape, a flat coil shape, and a spiral shape. Examples of arrangements include coated conductive wiring wound around the magnetic substrate 10 and conductors 20 of various shapes embedded in the magnetic substrate 10.

The first aspect described above is a low-loss coil component that is less likely to become magnetically saturated with respect to the current. This is because the magnetic substrate 10 is formed by bonding magnetic metal particles 1 to each other via a bonding layer 2 with excellent electrical insulating properties, thereby providing a high saturation magnetic flux density and resistivity.

[Coil Component Manufacturing Method 1]

The coil component manufacturing method in the second aspect of the present invention (referred to simply as the "second aspect" below) comprises: molding a magnetic metal powder composed of magnetic metal particles containing Fe, Si and Cr into a molded body; performing a first heat treatment by heating the molded body in a nitrogen atmosphere substantially free of oxygen after degreasing the molded body if necessary; performing a second heat treatment on the molded body after the first heat treatment in an oxygen-containing atmosphere to obtain a magnetic substrate; and arranging a conductor on the surface of the magnetic substrate.

The magnetic metal powder is composed of magnetic metal particles containing Fe, Si and Cr. The preferred content of each element in the magnetic metal particles is the same as that in the magnetic metal particles in the first aspect. When magnetic metal particles with a high Fe content are used as the magnetic metal powder, the particles are readily plastically deformed. This is preferred from the standpoint of a high powder filling rate when a molded body is produced using compression molding.

There are no particular restrictions on the method used to mold the magnetic metal powder. For example, a method can be used in which a magnetic metal powder is supplied to a mold and pressure is applied using a press to obtain a molded body by plastic deformation of the magnetic metal particles constituting the magnetic metal powder. In a molding method using a press, a mixture composed of a magnetic metal powder and a resin may be press-molded before curing the resin to form a molded body. A method in which green sheets containing a magnetic metal powder are laminated and pressure bonded may also be used.

When a molded body is obtained by press molding using a mold, the pressing conditions may be determined based on the type of magnetic metal powder, the type of resin mixed with the magnetic metal powder, and the blending ratio of these components. There are no particular restrictions on the resin mixed with the magnetic metal particles as long as the particles in the magnetic metal powder can be bonded to each other to form a shape that can be maintained, and as long as it does not leave behind carbon content, etc. after the degreasing treatment (debindering treatment) described below has been performed. Examples include acrylic resins, butyral resins, and vinyl resins with a decomposition temperature of 500° C. or lower. A lubricant such as stearic acid or a salt thereof, phosphoric acid or a salt thereof, or boric acid or a salt thereof may be used together with or instead of a resin. The amount of resin or lubricant added may be determined based on characteristics such as moldability and shape, and may be, for example, 0.1 to 5 parts by mass per 100 parts by mass magnetic metal powder.

When laminating and pressure-bonding green sheets to obtain a molded body, a method can be used in which green sheets are placed on top of each other using a suction conveyor and then subjected to thermocompression bonding using a press. When a plurality of coil components are obtained from a pressure-bonded laminate, the laminate may be cut up using a cutting machine such as a dicing machine or a laser cutting machine. In this case, the green sheets are typically manufactured by applying a slurry containing a magnetic metal powder and a binder to the surface of a base film such as a plastic film using a coating machine such as a doctor blade or a die coater, and then drying the slurry. There are no particular restrictions on the binder that is used as long as it can form a magnetic metal powder into a sheet that retains its shape, and can be removed by heat without leaving behind carbon content, etc. Examples include polyvinyl acetal resins such as polyvinyl butyral. There are no particular restrictions on the solvent used to prepare the slurry, but glycol ethers such as butyl carbitol can be used. The amount of each component in the slurry can be adjusted based on the method used to mold the green sheets and the characteristics of the green sheets that are to be prepared, such as the thickness.

In the second aspect, the first and second heat treatments described below are performed on the molded magnetic metal powder. However, when the molded body contains an organic substance such as a resin, a debindering treatment has to be performed prior to the first heat treatment to remove the organic substance. There are no particular restrictions on the conditions used in the debindering treatment as long as the binder can be removed while suppressing oxidation of the magnetic metal particles in the molded body. One example is keeping the temperature between 200 and 400° C. in the air for 30 minutes to five hours.

After subjecting the molded body composed of magnetic metal powder to a debindering treatment, the first heat treatment is performed by applying heat in a nitrogen atmosphere substantially free of oxygen. As a result, Cr nitride is produced on the surface of the magnetic metal particles, and the concentration of Cr on the surface increases. The increase in the concentration of Cr contributes to the formation of a bonding layer in which the Cr oxide concentration is sufficiently higher than the Fe oxide concentration in the magnetic substrate, and the insulating properties between magnetic metal particles are improved. In the present specification, a nitrogen atmosphere substantially free of oxygen means an atmosphere which a nitrogen concentration is not lower than that of a gas usually available as nitrogen gas, and an oxygen concentration of approximately 10 ppm or less.

There are no particular restrictions on the temperature and duration of the first heat treatment as long as the Cr concentration on the surface of the magnetic metal particles is sufficiently higher than the Fe concentration. One example is 30 minutes to three hours at a temperature from 500 to 800° C. Because a higher heat treatment temperature leads to a more active reaction between nitrogen and Cr and a larger amount of Cr diffused from the interior of the magnetic metal particles to the surface, the desired Cr concentration can be obtained in a heat treatment of shorter duration. Also, because a longer heat treatment time leads to a greater amount of Cr reacting with nitrogen and a larger amount of Cr diffused from the interior of the magnetic metal particles to the surface, the desired Cr concentration can be obtained when the heat treatment temperature is low. The first heat treatment temperature is preferably 550° C. or higher from the standpoint of increasing the amount of nitrogen in the bonding layer and obtaining a magnetic substrate with better electrical insulating properties.

The molded body subjected to the first heat treatment is then subjected to the second heat treatment in an oxygen-containing atmosphere. As a result, some of the Cr that formed a nitride on the surface of the magnetic metal particles and some of the elements present in the magnetic metal particles are oxidized to form a bonding layer that bonds the magnetic metal particles to each other and form a magnetic substrate.

There are no particular restrictions on the oxygen concentration in the atmosphere used in the second heat treatment as long as a magnetic substrate with the desired characteristics can be obtained at the applied heat treatment temperature and heat treatment time. In general, a higher oxygen concentration in the atmosphere makes it easier to obtain a bonded layer by performing heat treatment at a lower temperature and for a shorter time, but the difference in the surface and interior thickness of the bonded layer tends to increase in the molded body. Therefore, in determining the oxygen concentration in the atmosphere, an oxygen concentration suitable for the magnetic substrate to be manufactured may be selected by taking these general tendencies into account. An example of an oxygen concentration is from 500 to 5000 ppm, which facilitates the formation of a uniformly thin bonding layer with excellent electrical insulating properties and high mechanical strength.

There are no particular restrictions on the heat treatment temperature in the second heat treatment as long as a magnetic substrate with the desired characteristics can be obtained in the applied atmosphere and for the heat treatment time. In general, a higher heat treatment temperature facilitates the formation of a bonding layer by heat treatment in a lower oxygen atmosphere over a shorter period of time, but the increased Fe concentration in the bonding layer tends to cause the electrical insulating properties to decrease. Therefore, a heat treatment temperature suitable for the magnetic substrate to be manufactured may be selected by taking these general tendencies into account. An example of a heat treatment temperature is from 500 to 900° C., which facilitates the formation of a thin bonding layer with excellent electrical insulating properties and high mechanical strength.

There are no particular restrictions on the heat treatment duration in the second heat treatment as along as a magnetic substrate with the desired characteristics can be obtained at the oxygen concentration in the atmosphere and the heat treatment temperature. In general, a longer heat treatment time facilitates the formation of a bonding layer by heat treatment in a low oxygen atmosphere or at a low temperature, but the longer time required for production reduces productivity. Therefore, a heat treatment time suitable for the magnetic substrate to be manufactured may be selected by taking these general tendencies into account. An example of a heat treatment time is from 30 minutes to three hours, which facilitates the formation of a bonding layer of sufficient thickness with excellent electrical insulating properties and high mechanical strength.

The debindering treatment, the first heat treatment, and the second heat treatment may be performed continuously using a single heat treatment device that can make the switch between atmospheres and temperatures, or intermittently using two or more different heat treatment devices.

In the second aspect, the conductor is arranged on the surface of a magnetic substrate obtained via the second heat treatment. Specific examples of methods that can be used to arrange the conductor include winding a coated conductive wire around a magnetic substrate, and arranging a conductive precursor on the surface of a magnetic substrate, for example, by printing conductive paste, and then baking the precursor in a heating device such as a furnace.

[Coil Component Manufacturing Method 2]

The coil component manufacturing method in the third aspect of the present invention (referred to simply as the "third aspect" below) comprises: molding a magnetic metal powder composed of magnetic metal particles containing Fe, Si and Cr and a conductor or precursor thereof into a molded body with the conductor or precursor thereof arranged inside; performing a first heat treatment by heating the molded body in a nitrogen atmosphere substantially free of oxygen after degreasing the molded body if necessary; and performing a second heat treatment on the molded body after the first heat treatment in an oxygen-containing atmosphere.

Because the magnetic metal powder used in the third aspect is the same as the one used in the second aspect, further description of the magnetic metal powder has been omitted. Also, the method used to mold the magnetic metal powder can be the press molding method and the green sheet laminating and compression bonding method used in the second aspect.

In the third aspect, the conductor or precursor thereof is arranged inside the molded magnetic metal powder. Here, a conductor functions as the conductive path in the coil component as it is, and a precursor of a conductor contains a binder resin in addition to the conductive material forming the conductor in the coil component, and becomes a conductor during heat treatment. When the molded body is obtained by press molding, the method used to arrange the conductor or precursor thereof can be to fill a mold in which a conductor or a precursor thereof has been arranged beforehand with magnetic metal powder and then press molding the powder. When the molded body is obtained by laminating and compression bonding green sheets, the precursor of the conductor can be arranged on green sheets by printing conductive paste, etc. and the green sheets can be laminated and compression bonded.

When the conductor precursor is arranged using a conductive paste, the conductive paste can be one that contains conductive powder and an organic vehicle. Silver, copper, or an alloy thereof can be used as the conductive powder. There are no particular restrictions on the particle size of the conductive powder, but a conductive powder having an average particle size (median diameter ($D_{50}$)) of 1 μm to 10 μm as calculated from the particle size distribution measured in terms of volume can be used. The composition of the organic vehicle may be determined based on compatibility with the binder in the green sheet. One example is a polyvinyl acetal resin such as polyvinyl butyral (PVB) dissolved or swollen in a glycol ether solvent such as butyl carbitol. The mixing ratio of conductive powder to organic vehicle in the conductive paste can be adjusted based, for example, on the viscosity of a paste suitable for a printing machine and the coating thickness of the conductive pattern to be formed.

Because the conditions in the third aspect for the first and second heat treatments performed on the molded body, and if necessary the debindering treatment performed before the first heat treatment, are the same as those in the second aspect, further description has been omitted.

In the second aspect and third aspect, a coil component composed of a magnetic substrate with high electrical insulating properties described in the first aspect can be obtained.

[Circuit Board]

The circuit board in the fourth aspect of the present invention (referred to simply as the "fourth aspect" below) is a circuit board on which a coil component related to the first aspect has been mounted.

There are no particular restrictions on the structure of the circuit board, and one suitable for the intended purpose for the circuit board may be adopted.

The fourth aspect experiences less loss due to the use of a coil component related to the first aspect.

EXAMPLES

A more detailed description of the present invention will now be described with reference to examples. However, the present invention is not limited to these examples.

Example 1

(Manufacture of Magnetic Substrate)

A magnetic metal powder composed of Fe—Si—Cr-based magnetic metal particles containing 96 wt % of Fe, 2 wt % of Si, and 2 wt % of Cr, where the total amount of Fe, Si and Cr is 100 wt %, was prepared with an average particle size of 4 μm. This magnetic metal powder was mixed with a polyvinyl butyral (PVB)-based binder resin and a dispersion medium to prepare a slurry. The resulting slurry was applied to PET film using the doctor blade method and dried to obtain green sheets. The green sheets were then laminated and compression-bonded at a pressure of 7 ton/cm² to form a molded body. After performing debindering in the air at 350° C. for two hours, the molded body was subjected to a first heat treatment at 600° C. for one hour in a $N_2$ atmosphere ($O_2$ concentration of 10 ppm or less) and then a second heat treatment at 600° C. for one hour in an $N_2$—$O_2$ mixed atmosphere ($O_2$ concentration of 1600 ppm) to obtain the magnetic substrate test sample in Example 1.

(Compositional Analysis of Bonding Layer on Magnetic Substrate)

The composition of the bonding layer in the resulting magnetic substrate test sample was determined in accordance with the method described above using a STEM-EDS (JEM2100F from JEOL Ltd.). When the atomic ratio of nitrogen to oxygen (N/O) and the atomic ratio of chromium (Cr) to iron (Fe) (Cr/Fe) were calculated from the resulting composition, the results were N/O=0.10 and Cr/Fe=5.7.

(Measurement of Magnetic Substrate Resistivity ρ)

The resistivity ρ of the resulting magnetic substrate test sample was measured in order to determine its electrical insulating properties. First, Ag paste was applied to the front and back surfaces (the two opposite surfaces with the largest area) of the magnetic substrate test sample with a diameter of 8 mm and a thickness of 0.5 mm, and the magnetic substrate test sample was baked to form electrodes. Next, the electrical resistance value of the magnetic substrate test sample was measured using an ohmmeter (RM3544 from Hioki E.E. Corporation), and the resistivity (Ω·cm) was calculated from the resulting electrical resistance value, the electrode area, and the thickness of the magnetic substrate test sample. The resulting resistivity ρ was $1.3 \times 10^7$ Ω·cm.

Examples 2-4

(Manufacture of Magnetic Substrate)

The magnetic substrate test samples in Example 2, Example 3 and Example 4 were produced in the same manner as in Example 1 except that the temperature in the first heat treatment was changed to 500° C. (Example 2), 550° C. (Example 3), and 650° C. (Example 4).

(Compositional Analysis of Bonding Layer on Magnetic Substrate and Measurement of Magnetic Substrate Resistivity)

The composition of the bonding layer in the resulting magnetic substrate test samples was determined and the resistivity of the magnetic substrate test samples was measured in the same manner as Example 1. In the magnetic substrate test sample according to Example 2, the N/O ratio of the bonding layer was 0.03, the Cr/Fe ratio of the bonding layer was 1.7, and the resistivity ρ was $6.6 \times 10^6$ Ω·cm. In the magnetic substrate test sample according to Example 3, the N/O ratio of the bonding layer was 0.04, the Cr/Fe ratio of the bonding layer was 3.0, and the resistivity ρ was $3.0 \times 10^6$ Ω·cm. In the magnetic substrate test sample according to Example 4, the N/O ratio of the bonding layer was 0.15, the Cr/Fe ratio of the bonding layer was 6.7, and the resistivity ρ was $1.5 \times 10^7$ Ω·cm.

Example 5-6

(Manufacture of Magnetic Substrate)

The magnetic substrate test samples in Example 5 and Example 6 were produced in the same manner as in Example 1 except that the oxygen concentration in the atmosphere of the second heat treatment was changed to 800 ppm (Example 5) and 3000 ppm (Example 6).

(Compositional Analysis of Bonding Layer on Magnetic Substrate and Measurement of Magnetic Substrate Resistivity)

The composition of the bonding layer in the resulting magnetic substrate test samples was determined and the specific resistivity of the magnetic substrate test samples was measured in the same manner as Example 1. In the magnetic substrate test sample according to Example 5, the N/O ratio of the bonding layer was 0.07, the Cr/Fe ratio of the bonding layer was 4.5, and the resistivity ρ was $1.0 \times 10^7$ Ω·cm. In the magnetic substrate test sample according to Example 6, the N/O ratio of the bonding layer was 0.13, the Cr/Fe ratio of the bonding layer was 6.2, and the resistivity ρ was $1.4 \times 10^7$ Ω·cm.

Comparative Example 1

(Manufacture of Magnetic Substrate)

The magnetic substrate test sample in Comparative Example 1 was produced in the same manner as in Example 1 except that the first heat treatment was not performed.

(Compositional Analysis of Bonding Layer on Magnetic Substrate and Measurement of Magnetic Substrate Resistivity)

The composition of the bonding layer in the resulting magnetic substrate test sample was determined and the specific resistivity of the magnetic substrate test sample was measured in the same manner as Example 1. As a result, the N/O ratio of the bonding layer was 0.01, the Cr/Fe ratio of the bonding layer was 0.8, and the resistivity ρ was $5.4 \times 10^5$ Ω·cm.

Figure 3:
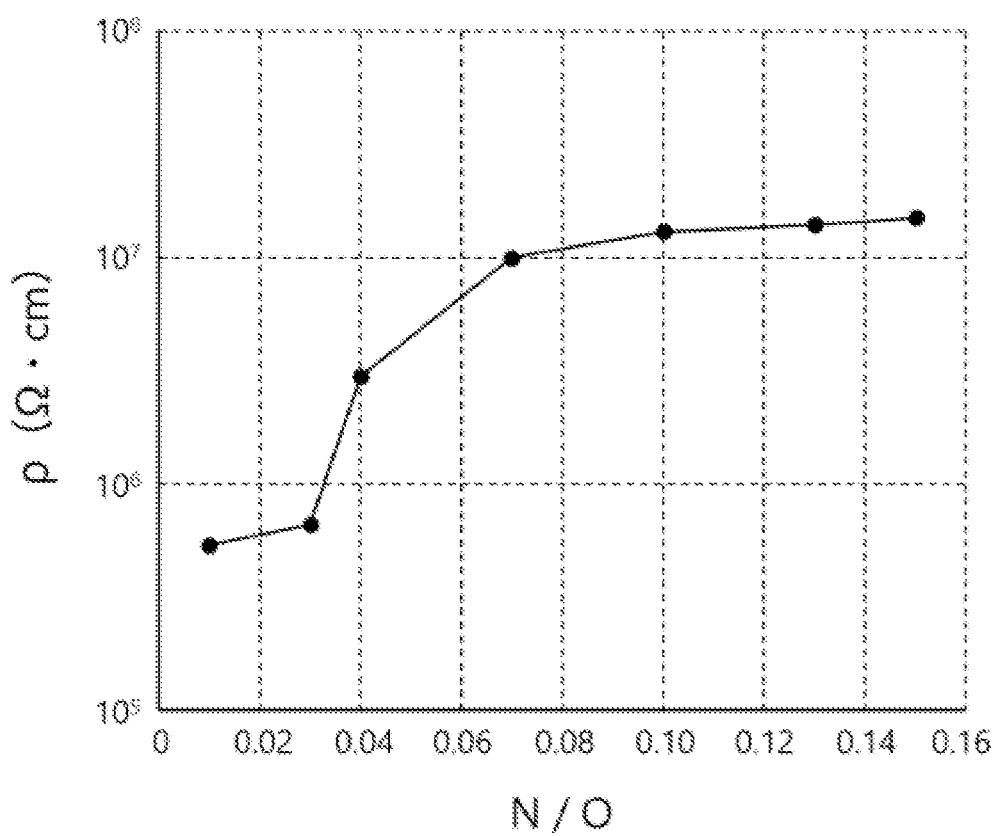
FIG. 3 is a graph showing the relationship between the N/O ratio in the bonding layer and the resistivity of the magnetic substrate in examples of the present invention and a comparative example.
Figure 4:
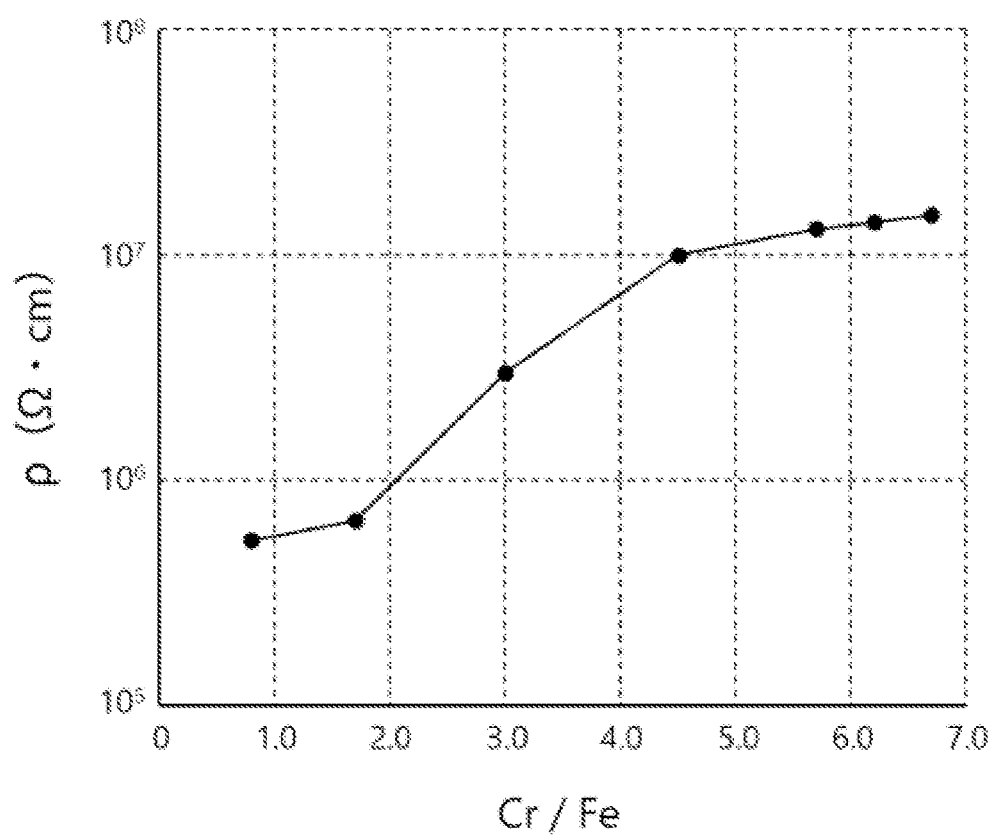
FIG. 4 is a graph showing the relationship between the Cr/Fe ratio in the bonding layer and the resistivity of the magnetic substrate in examples of the present invention and a comparative example.

The results for the examples and comparative examples described above are summarized in Table 1. FIG. 3 is a graph showing the relationship between the N/O ratio in the bonding layer and the resistivity of the magnetic substrate and FIG. 4 is a graph showing the relationship between the Fe/Cr ratio in the bonding layer and the resistivity of the magnetic substrate that were prepared based on these results.

TABLE 1

| | 1st Heat Processing Temp. (° C.) | 2nd Heat Processing Temp. (° C.) and Atmosphere | N/O | Cr/Fe | Resistivity (Ω · cm) |
|---|---|---|---|---|---|
| Ex. 1 | 600 | 600° C. $N_2$-1600 ppm $O_2$ | 0.10 | 5.7 | $1.3 \times 10^7$ |
| Ex. 2 | 500 | 600° C. $N_2$-1600 ppm $O_2$ | 0.03 | 1.7 | $6.6 \times 10^5$ |
| Ex. 3 | 550 | 600° C. $N_2$-1600 ppm $O_2$ | 0.04 | 3.0 | $3.0 \times 10^6$ |
| Ex. 4 | 650 | 600° C. $N_2$-1600 ppm $O_2$ | 0.15 | 6.7 | $1.5 \times 10^7$ |
| Ex. 5 | 600 | 600° C. $N_2$-800 ppm $O_2$ | 0.07 | 4.5 | $1.0 \times 10^7$ |
| Ex. 6 | 600 | 600° C. $N_2$-3000 ppm $O_2$ | 0.13 | 6.2 | $1.4 \times 10^7$ |
| C. Ex. 1 | — | 600° C. $N_2$-1600 ppm $O_2$ | 0.01 | 0.8 | $5.4 \times 10^5$ |

It is clear from these results that, when manufacturing a magnetic substrate, a bonding layer containing nitrogen in addition to oxygen can be formed that exhibits excellent electrical insulating properties if a first heat treatment is performed after degreasing in a nitrogen atmosphere substantially free of oxygen and a second heat treatment is performed in an oxygen-containing atmosphere. It is especially clear that in a magnetic substrate with an N/O ratio of 0.04 or more in the bonding layer, the resistivity value rises sharply and even better electrical insulating properties are obtained. It is also clear that in a magnetic substrate with an N/O ratio of 0.07 or more in the bonding layer, a resistivity on the order of $10^7$ Ω·cm is achieved and exceptionally good electrical insulating properties can be obtained.

Reference Examples 1-2

A study was conducted to determine whether the N/O ratio changed in the bonding layer when the temperature of the second heat treatment was raised. This is because the oxidation reaction of the components in the magnetic substrate becomes more active when the temperature of the second heat treatment rises, and there is concern that magnetite formation will begin due to Fe oxidation and electrical insulating properties will deteriorate after most of the Cr nitride or oxynitride in the bonding layer has been oxidized. If the N/O ratio in the bonding layer could be kept high, Fe oxidation would be suppressed even as the temperature of the second heat treatment rose.

(Manufacture of Magnetic Substrate)

The magnetic substrate test samples in Reference Example 1 and Reference Example 2 were produced in the same manner as in Example 1 except that the temperature in the second heat treatment was changed to 700° C. (Reference Example 1) and 800° C. (Reference Example 2).

(Compositional Analysis of Bonding Layer on Magnetic Substrate)

The composition of the bonding layer in the resulting magnetic substrate test samples was determined in the same manner as in Example 1. The N/O ratio of the bonding layer was 0.16 in both Reference Example 1 and Reference Example 2. It is clear from these results that the presence of Cr nitride or oxynitride in the bonding layer remained stable even after the temperature of the second heat treatment was raised within the range of this study.

INDUSTRIAL APPLICABILITY

The present invention is able to provide a coil component equipped with a powder core having high electrical insulating properties as a magnetic substrate in which magnetic metal particles are bonded to each other via a thin insulating film. Because magnetic metal particles that are unlikely to become magnetically saturated are present in the magnetic substrate at a large volume ratio, this coil component can handle a large current. Because the bonding layer that bonds the magnetic metal particles together has good electrical insulating properties, the resistivity of the magnetic substrate increases, the current flows with greater difficulty, and energy loss is low. As a result, the present invention is useful with respect to improving the performance and reducing the size of coil components.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A coil component comprising: a magnetic substrate formed with magnetic metal particles containing Fe, Si and Cr, and a bonding layer containing oxygen and nitrogen that bonds the magnetic metal particles to each other, wherein an atomic ratio (N/O) of nitrogen (N) to oxygen (O) in the bonding layer is 0.03 or more and 0.20 or less; and a conductor arranged inside or on the surface of the magnetic substrate.

2. The coil component according to claim 1, wherein the atomic ratio (N/O) of nitrogen (N) to oxygen (O) in the bonding layer is 0.04 or more.

3. The coil component according to claim 1, wherein the magnetic metal particles have an Fe content of 90 mass % or more, and the atomic ratio (Cr/Fe) of chromium (Cr) to iron (Fe) in the bonding layer is 3.0 or more.

4. A circuit board on which the coil component according to claim 1 has been mounted.

5. A method for manufacturing a coil component, the method comprising: molding a magnetic metal powder composed of magnetic metal particles containing Fe, Si and Cr into a molded body; performing a first heat treatment by heating the molded body in a nitrogen atmosphere substantially free of oxygen; performing a second heat treatment on the molded body after the first heat treatment in an oxygen-containing atmosphere to obtain a magnetic substrate; and arranging a conductor on the surface of the magnetic substrate.

6. The method for manufacturing a coil component according to claim 5, wherein the first heat treatment is performed at a temperature of 550° C. or higher.

7. A method for manufacturing a coil component, the method comprising: molding a magnetic metal powder composed of magnetic metal particles containing Fe, Si and Cr and a conductor or precursor thereof into a molded body with the conductor or precursor thereof arranged inside; performing a first heat treatment by heating the molded body in a nitrogen atmosphere substantially free of oxygen; and performing a second heat treatment on the molded body after the first heat treatment in an oxygen-containing atmosphere.

8. The method for manufacturing a coil component according to claim 7, wherein the first heat treatment is performed at a temperature of 550° C. or higher.

\* \* \* \* \*